(12) United States Patent
Kwon et al.

(10) Patent No.: US 11,749,592 B2
(45) Date of Patent: Sep. 5, 2023

(54) PACKAGE-ON-PACKAGE TYPE SEMICONDUCTOR PACKAGE INCLUDING A LOWER SEMICONDUCTOR PACKAGE AND AN UPPER SEMICONDUCTOR PACKAGE

(71) Applicant: SAMSUNG ELECTRONICS CO., LTD., Suwon-si (KR)

(72) Inventors: Donguk Kwon, Asan-si (KR); Jiwon Shin, Daejeon (KR); Kwangbok Woo, Cheonan-si (KR); Minseung Ji, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 97 days.

(21) Appl. No.: 17/348,936

(22) Filed: Jun. 16, 2021

(65) Prior Publication Data

US 2022/0122908 A1    Apr. 21, 2022

(30) Foreign Application Priority Data

Oct. 15, 2020  (KR) .................. 10-2020-0133736

(51) Int. Cl.
*H01L 23/498* (2006.01)
*H01L 23/32* (2006.01)
(Continued)

(52) U.S. Cl.
CPC .... *H01L 23/49833* (2013.01); *H01L 23/3121* (2013.01); *H01L 23/32* (2013.01);
(Continued)

(58) Field of Classification Search
CPC ........... H01L 23/49833; H01L 23/3121; H01L 23/32; H01L 23/49816; H01L 24/16; H01L 24/73; H01L 25/105; H01L 2224/16227; H01L 2224/32227; H01L 2224/73204; H01L 2225/1023; H01L 2225/1058; H01L 23/49894; H01L 23/5389; H01L 25/0657; H01L 25/50; H01L 23/3128; H01L 23/3135; H01L 24/13; H01L 24/29;
(Continued)

(56) References Cited

U.S. PATENT DOCUMENTS 8,017,437 B2    9/2011  Yoo et al.
8,704,350 B2    4/2014  Park et al.
(Continued)

FOREIGN PATENT DOCUMENTS

KR    10-1648199    8/2016

*Primary Examiner* — Douglas W Owens
(74) *Attorney, Agent, or Firm* — F. Chau & Associates, LLC

(57) ABSTRACT

A lower semiconductor package of a package-on-package type semiconductor package includes: a package substrate; a semiconductor chip mounted on the package substrate; a chip connecting terminal disposed between the semiconductor chip and the package substrate and configured to connect the semiconductor chip to the package substrate; conductive pillars arranged on the package substrate to at least partially surround the semiconductor chip; and a dam structure configured to cover the conductive pillars on the package substrate and having a first opening at least partially surrounding the semiconductor chip.

20 Claims, 16 Drawing Sheets

(51) Int. Cl.
  *H01L 23/00*    (2006.01)
  *H01L 23/31*    (2006.01)
  *H01L 25/10*    (2006.01)

(52) U.S. Cl.
  CPC ........ *H01L 23/49816* (2013.01); *H01L 24/16* (2013.01); *H01L 24/73* (2013.01); *H01L 25/105* (2013.01); *H01L 2224/16227* (2013.01); *H01L 2224/32227* (2013.01); *H01L 2224/73204* (2013.01); *H01L 2225/1023* (2013.01); *H01L 2225/1058* (2013.01)

(58) Field of Classification Search
  CPC ......... H01L 24/32; H01L 24/48; H01L 24/81; H01L 24/92
  See application file for complete search history.

(56) References Cited

U.S. PATENT DOCUMENTS

| | | |
|---|---|---|
| 9,299,648 B2 | 3/2016 | Shim et al. |
| 10,002,857 B2 | 6/2018 | Solimando et al. |
| 10,373,941 B2 | 8/2019 | Huang et al. |
| 10,475,749 B2 * | 11/2019 | Kim .................... H01L 25/0657 |
| 10,535,616 B2 | 1/2020 | Chen et al. |
| 10,546,844 B2 * | 1/2020 | Kim ...................... H01L 25/105 |
| 2014/0084478 A1 * | 3/2014 | Simion ............. H01L 23/49811 |
| | | 438/109 |
| 2018/0053753 A1 | 2/2018 | Singh et al. |
| 2019/0103364 A1 * | 4/2019 | Kim .................... H01L 25/0657 |

* cited by examiner

PACKAGE-ON-PACKAGE TYPE SEMICONDUCTOR PACKAGE INCLUDING A LOWER SEMICONDUCTOR PACKAGE AND AN UPPER SEMICONDUCTOR PACKAGE

CROSS-REFERENCE TO RELATED APPLICATION

This application claims priority under 35 U.S.C. § 119 to Korean Patent Application No. 10-2020-0133736, filed on Oct. 15, 2020, in the Korean Intellectual Property Office, the disclosure of which is incorporated by reference herein in its entirety.

TECHNICAL FIELD

The present inventive concept relates to a semiconductor package, and more particularly, to a package-on-package type semiconductor package including a lower semiconductor package and an upper semiconductor package.

DISCUSSION OF THE RELATED ART

As the storage capacity of semiconductor chips increases, semiconductor packages including semiconductor chips are increasingly desired to be thin and light. In addition, semiconductor packages including semiconductor chips of various functions and means of quickly driving the semiconductor chips are under development.

In response to this trend, a package-on-package type semiconductor package having a structure in which an upper semiconductor package is mounted on a lower semiconductor package is currently under development. For example, a method of electrically connecting a lower semiconductor package to an upper semiconductor package and a method of increasing the structural reliability of a package-on-package type semiconductor package is currently under development.

SUMMARY

According to an exemplary embodiment of the present inventive concept, a lower semiconductor package of a package-on-package type semiconductor package includes: a package substrate; a semiconductor chip mounted on the package substrate; a chip connecting terminal disposed between the semiconductor chip and the package substrate and configured to connect the semiconductor chip to the package substrate; conductive pillars arranged on the package substrate to at least partially surround the semiconductor chip; and a dam structure configured to cover the conductive pillars on the package substrate and having a first opening at least partially surrounding the semiconductor chip.

According to an exemplary embodiment of the present inventive concept, a lower semiconductor package of a package-on-package type semiconductor package includes: a package substrate; a semiconductor chip mounted on the package substrate; a chip connecting terminal disposed between the semiconductor chip and the package substrate and configured to connect the semiconductor chip to the package substrate; a dam structure disposed at edges of the package substrate and having a first opening at least partially surrounding the semiconductor chip; an interposer including an interposer substrate mounted on the dam structure; interposer connecting pillars at least partially surrounding the semiconductor chip on the package substrate and passing through the dam structure in a vertical direction to connect the package substrate to the interposer substrate; and a first lower molding member configured to fill the first opening of the dam structure and covered by the package substrate, the dam structure, and the interposer substrate.

According to an exemplary embodiment of the present inventive concept, a package-on-package (PoP) type semiconductor package includes: a lower semiconductor package; and an upper semiconductor package. The lower semiconductor package includes: a package substrate; a lower semiconductor chip mounted on the package substrate; a chip connecting terminal disposed between the lower semiconductor chip and the package substrate and configured to connect the lower semiconductor chip to the package substrate; a dam structure disposed at edges of the package substrate, and including a solder resist material and a first opening at least partially surrounding the semiconductor chip; an interposer including an interposer substrate mounted on the dam structure; interposer connecting pillars at least partially surrounding the semiconductor chip on the package substrate and passing through the dam structure in a vertical direction to connect the package substrate to the interposer substrate; and a first lower molding member, configured to fill the first opening of the dam structure and surrounded by the package substrate, the dam structure, and the interposer substrate. The upper semiconductor package includes: a re-wiring structure; an upper semiconductor chip mounted on the re-wiring structure; an upper molding layer surrounding the upper semiconductor chip on the re-wiring structure; and a package connecting terminal disposed on the re-wiring structure and configured to connect the upper semiconductor chip to the interposer.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1:
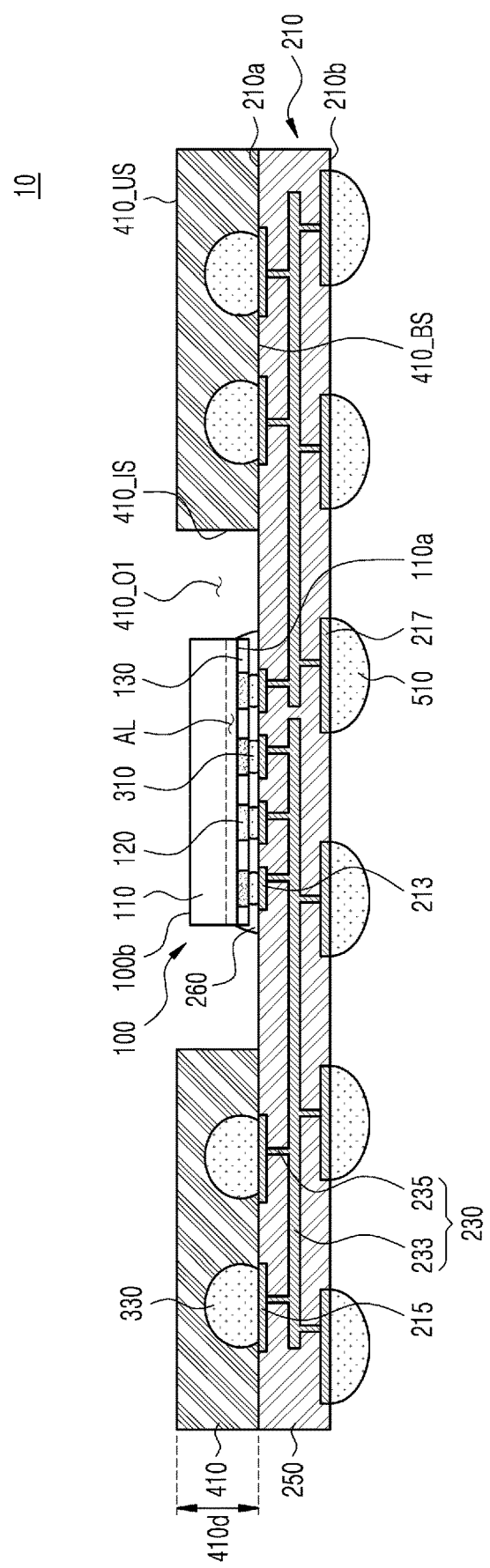
FIG. 1 is a diagram illustrating a semiconductor package according to an exemplary embodiment of the present inventive concept.

FIG. 1 is a diagram showing a semiconductor package 10 according to an exemplary embodiment of the present inventive concept. The semiconductor package 10 of FIG. 1 may be a lower semiconductor package constituting a package-on-package (PoP) type semiconductor package.

The semiconductor package 10 may include a package substrate 210, a semiconductor chip 100, an underfill member 260, a chip connecting terminal 310, a conductive pillar 330, a dam structure 410, and an external connecting terminal 510.

The package substrate 210 of the semiconductor package 10 may be a substrate for connecting the semiconductor chip 100 mounted on the package substrate 210 to an external device. The package substrate 210 may have a top surface 210a and a bottom surface 210b. For example, the top surface 210a of the package substrate 210 may be a surface on which the semiconductor chip 100 is mounted, and the bottom surface 210b may be a surface opposite to the top surface 210a and a on which the external connecting terminal 510 is attached.

In an exemplary embodiment of the present inventive concept, the package substrate 210 may be a double-sided printed circuit board (PCB) having a first package substrate pad 213 and a second package substrate pad 215 on the top surface 210a and having a third package substrate pad 217 on the bottom surface 210b. For example, the first package substrate pad 213 and the second package substrate pad 215 may be exposed at the top surface 210a, and the third package substrate pad 217 may be exposed at the bottom surface 210b. However, the package substrate 210 is not limited to the structure and the material of a PCB and may include various types of substrates, e.g., a ceramic substrate.

In an exemplary embodiment of the present inventive concept, the package substrate 210 may include a package substrate pattern 230, a package substrate insulation layer 250, and the first to third package substrate pads 213, 215, and 217.

In an exemplary embodiment of the present inventive concept, the package substrate pattern 230 may include a package substrate line pattern 233 and package substrate via pattern 235. The package substrate line pattern 233 may extend in a horizontal direction within the package substrate insulation layer 250, and the package substrate via pattern 235 may extend in a vertical direction within the package substrate insulation layer 250.

In an exemplary embodiment of the present inventive concept, a material constituting the package substrate pattern 230 may include copper (Cu). However, the material constituting the package substrate pattern 230 is not limited thereto, and the material constituting the package substrate pattern 230 may include metals such as nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru), or an alloy thereof.

The package substrate insulation layer 250 may at least partially surround the package substrate pattern 230. In an exemplary embodiment of the present inventive concept, the material constituting the package substrate insulation layer 250 may include an oxide or a nitride. For example, the package substrate insulation layer 250 may include silicon oxide or silicon nitride.

In an exemplary embodiment of the present inventive concept, the first package substrate pad 213 may be a pad provided on the top surface 210a of the package substrate 210 and configured to connect the semiconductor chip 100 to the package substrate pattern 230.

In addition, the second package substrate pad 215 may be a pad provided on the top surface 210a of the package substrate 210 to be between the first package substrate pad 213 and an edge of the package substrate insulation layer 250 and configured to connect the conductive pillar 330 to the package substrate pattern 230.

In addition, the third package substrate pad 217 may be a pad provided on the bottom surface 210b of the package substrate 210 and configured to connect the external connecting terminal 510 to the package substrate pattern 230.

The semiconductor chip 100 may be mounted on the top surface 210a of the package substrate 210. In an exemplary embodiment of the present inventive concept, the semiconductor chip 100 may include a semiconductor substrate 110, a chip pad 120, and a passivation layer 130.

In an exemplary embodiment of the present inventive concept, the semiconductor chip 100 may include a logic semiconductor chip. The logic semiconductor chip may include, for example, a logic semiconductor chip like a central processor unit (CPU), a micro processor unit (MPU), a graphics processor unit (GPU), or an application processor (AP).

In addition, the semiconductor chip 100 may include a memory semiconductor chip. The memory semiconductor chip may include, for example, a volatile memory semiconductor chip like dynamic random access memory (DRAM) or static random access memory (SRAM) and may also include a non-volatile memory chip like phase-change random access memory (PRAM), magneto-resistive random access memory (MRAM) ferroelectric random access memory (FeRAM), or resistive random access memory (RRAM).

Although FIG. 1 shows that the semiconductor package 10 includes one semiconductor chip 100, the present inventive concept is not limited thereto, and the semiconductor package 10 may include two or more semiconductor chips. For example, the semiconductor package 10 may include a plurality of semiconductor chips, and the semiconductor package 10 may be a system-in-package (SIP) in which a plurality of different types of semiconductor chips are electrically connected to one another and operate as a single system.

The semiconductor substrate 110 of the semiconductor chip 100 may have a first surface 110a and a second surface 100b. The first surface 110a may be a surface of the semiconductor substrate 110 facing the package substrate 210 and on which the chip pad 120 may be attached. The second surface 100b may be a surface opposite to the first surface 110a and may be the top surface of the semiconductor chip 100.

In an exemplary embodiment of the present inventive concept, the semiconductor substrate 110 may include silicon (Si). In addition, the semiconductor substrate 110 may include a semiconductor element like germanium (Ge) or a compound semiconductor like silicon carbide (SiC), gallium arsenide (GaAs), indium arsenide (InAs), and indium phosphide (InP). However, the material constituting the semiconductor substrate 110 is not limited thereto.

In an exemplary embodiment of the present inventive concept, the semiconductor substrate 110 may have an active layer AL adjacent to the first surface 110a of the semiconductor substrate 110. For example, the active layer AL of the semiconductor chip 100 may be formed on a portion of the semiconductor substrate 110 adjacent to the package substrate 210.

In an exemplary embodiment of the present inventive concept, the active layer AL may include a plurality of individual devices of various types. For example, the individual devices may include various microelectronic devices, e.g., a complementary metal-oxide semiconductor (CMOS) transistor, a metal-oxide-semiconductor field effect transistor (MOSFET), a system large scale integration (LSI), an image sensor such as a CMOS imaging sensor (CIS), a micro-electro-mechanical system (MEMS), an active device, a passive device, etc.

The chip pad 120 of the semiconductor chip 100 may be a pad provided on the first surface 110a of the semiconductor substrate 110 and electrically connected to the individual devices in the active layer AL. As shown in FIG. 1, a plurality of chip pads 120 of the semiconductor chip 100 may be provided.

The passivation layer 130 of the semiconductor chip 100 may be a layer at least partially surrounding side surfaces of the chip pad 120 on the first surface 110a of the semiconductor substrate 110. In addition, the passivation layer 130 may expose one surface of the chip pad 120.

In an exemplary embodiment of the present inventive concept, the passivation layer 130 may include silicon nitride (SiN). However, the material of the passivation layer 130 is not limited thereto, and for example, the passivation layer 130 may include one of silicon oxynitride (SiON), silicon oxide (SiO2), silicon carbonate nitride (SiOCN), silicon carbonitride (SiCN), and a combination thereof.

The chip connecting terminal 310 may be a terminal provided between the semiconductor chip 100 and the package substrate 210 and configured to connect the semiconductor chip 100 and the package substrate 210 to each other. For example, the chip connecting terminal 310 may be a pad provided between the chip pad 120 of the semiconductor chip 100 and the first package substrate pad 213 of the package substrate 210 and electrically connect the chip pad 120 to the first package substrate pad 213.

In an exemplary embodiment of the present inventive concept, the chip connecting terminal 310 may be, for example, a solder ball including a metal material including at least one of Sn, Ag, Cu, and/or Al.

The underfill member 260 may at least partially surround the chip connecting terminal 310 between the semiconductor chip 100 and the package substrate 210. In addition, the underfill member 260 may at least partially surround at least a portion of side surfaces of the semiconductor chip 100. The underfill member 260 may fix the semiconductor chip 100 on the top surface 110a of the package substrate 210.

In an exemplary embodiment of the present inventive concept, the underfill member 260 may include at least one of an insulating polymer and an epoxy resin. For example, the underfill member 260 may include an epoxy molding compound (EMC).

Conductive pillars 330 may be provided on the top surface 210a of the package substrate 210 to at least partially surround edges of the semiconductor chip 100. For example, the conductive pillars 330 may be pillars of a conductive material provided on the second package substrate pad 215 of the package substrate 210.

In an exemplary embodiment of the present inventive concept, the conductive pillar 330 may be connected to an interposer connecting terminal (630 of FIG. 3) of an interposer (60 of FIG. 3) to be described later. For example, the conductive pillar 330 may be a solder ball including a metal material including at least one of Sn, Ag, Cu, and/or Al.

The dam structure 410 may be a structure that at least partially covers the conductive pillar 330 on the top surface 210a of the package substrate 210 and exposes the semiconductor chip 100. For example, the dam structure 410 may cover the conductive pillars 330 provided adjacent to the edges of the package substrate 210 and may expose the semiconductor chip 100 provided at the center of the package substrate 210 to the outside.

For example, the dam structure 410 may include inner side surfaces 410_IS and may have a first opening 410_O1 at least partially surrounding the edges of the semiconductor chip 100.

In an exemplary embodiment of the present inventive concept, the dam structure 410 may be, for example, a solder resist material layer. For example, when the dam structure 410 includes a solder resist material layer, the dam structure 410 may prevent an electrical short-circuit between the conductive pillars 330 and may protect surfaces of the conductive pillars 330 from dust, moisture, or physical shock.

In an exemplary embodiment of the present inventive concept, a thickness 410d of the dam structure 410 may be between about 120 micrometers and about 500 micrometers. The thickness 410d of the dam structure 410 may be a distance between a top surface 410_US and a bottom surface 410_BS of the dam structure 410 in a vertical direction. For example, the thickness 410d of the dam structure 410 may be from about 150 micrometers to about 200 micrometers.

In an exemplary embodiment of the present inventive concept, the dam structure 410 may include a reactive organic material as a base material and may include at least one of an epoxy that may be cured thermally, an acrylic material that may be cured with ultraviolet rays, and/or an insulating polymer.

In an exemplary embodiment of the present inventive concept, the level of the top surface 410_US of the dam structure 410 may be higher than the level of the second surface 100b of the semiconductor chip 100. The level of the top surface 410_US of the dam structure 410 may be a length in the vertical direction from the first surface 210a of the package substrate 210 to the top surface 410_US of the dam structure 410, and the level of the second surface 100b of the semiconductor chip 100 may be a length in the vertical direction from the first surface 210a of the package substrate 210 to the second surface 100b of the semiconductor chip 100.

The external connecting terminal 510 is connected to the third package substrate pad 217 of the package substrate 210 and may be a terminal for connecting the package substrate 210 to an external device. The external connecting terminal 510 may include a metal material including at least one of Ag, Cu, and/or Al.

Figure 2:
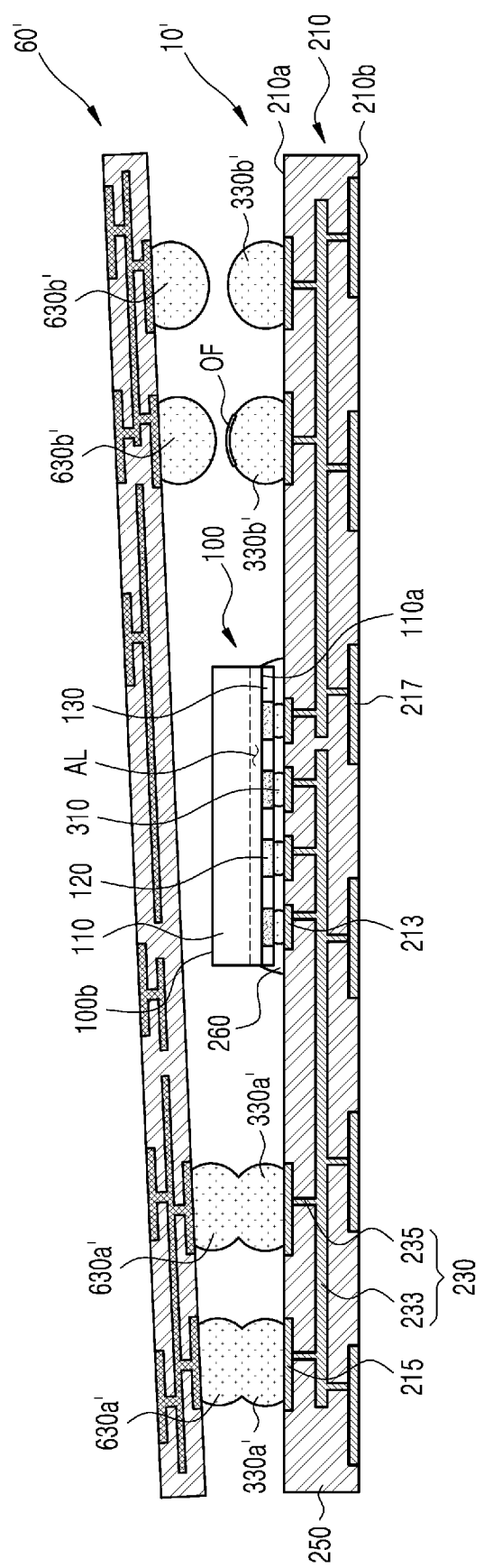
FIG. 2 is a diagram illustrating an operation of mounting an interposer on a semiconductor package according to a comparative example.

FIG. 2 is a diagram showing an operation of mounting an interposer 60' on a semiconductor package 10' according to a comparative example.

The semiconductor package 10' according to the comparative example may include substantially the same components of the semiconductor package 10 described above with reference to FIG. 1 other than the dam structure 410.

Referring to FIG. 2, the interposer 60' may be mounted on the semiconductor package 10' when the interposer 60' and the semiconductor package 10' are misaligned or the interposer 60 is inclined in one direction.

In this case, excessive pressing may occur between first conductive pillars 330a' of the semiconductor package 10' and first interposer connecting terminals 630a' of the interposer 60'. Therefore, the risk of a short-circuit between the first conductive pillars 330a' may increase.

In addition, second conductive pillars 330b' arranged on a side of the semiconductor package 10' opposite to the first conductive pillars 330a' may be separated from second interposer connecting terminals 630b' of the interposer 60'. Therefore, a defect may occur in the electrical connection between the semiconductor package 10' and the interposer 60'.

In addition, before the operation of mounting the interposer 60' on the semiconductor package 10', when the first conductive pillars 330a' and the second conductive pillars 330b' are exposed to the outside for a relatively long time, oxide films OF may be formed on surfaces of the first conductive pillars 330a' and the second conductive pillars 330b'.

When the oxide films OF are formed on the surfaces of the first conductive pillars 330a' and the second conductive pillars 330b', a defect may occur in the electrical connection between the semiconductor package 10' and the interposer 60', and the structural reliability between the semiconductor package 10' and the interposer 60' may be deteriorated.

To resolve the above-described short-circuit, defects and deterioration, the semiconductor package 10 according to according to an exemplary embodiment of the present inventive concept may be provided.

Figure 3:
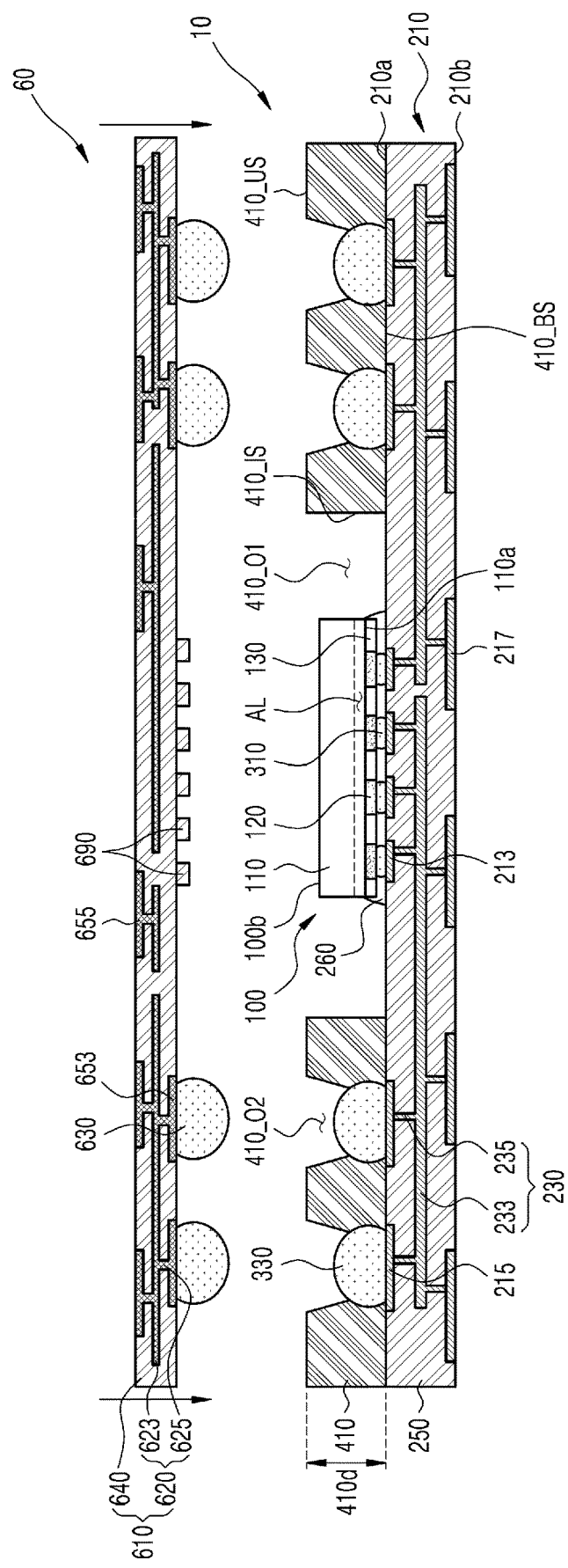
FIG. 3 is a diagram illustrating an operation of mounting an interposer on a semiconductor package according to an exemplary embodiment of the present inventive concept.

FIG. 3 is a diagram showing an operation of mounting the interposer 60 on the semiconductor package 10 according to an exemplary embodiment of the present inventive concept. Since the technical spirit of the semiconductor package 10 is identical to the description given above with reference to FIG. 1, detailed description thereof may be omitted.

Figure 6:
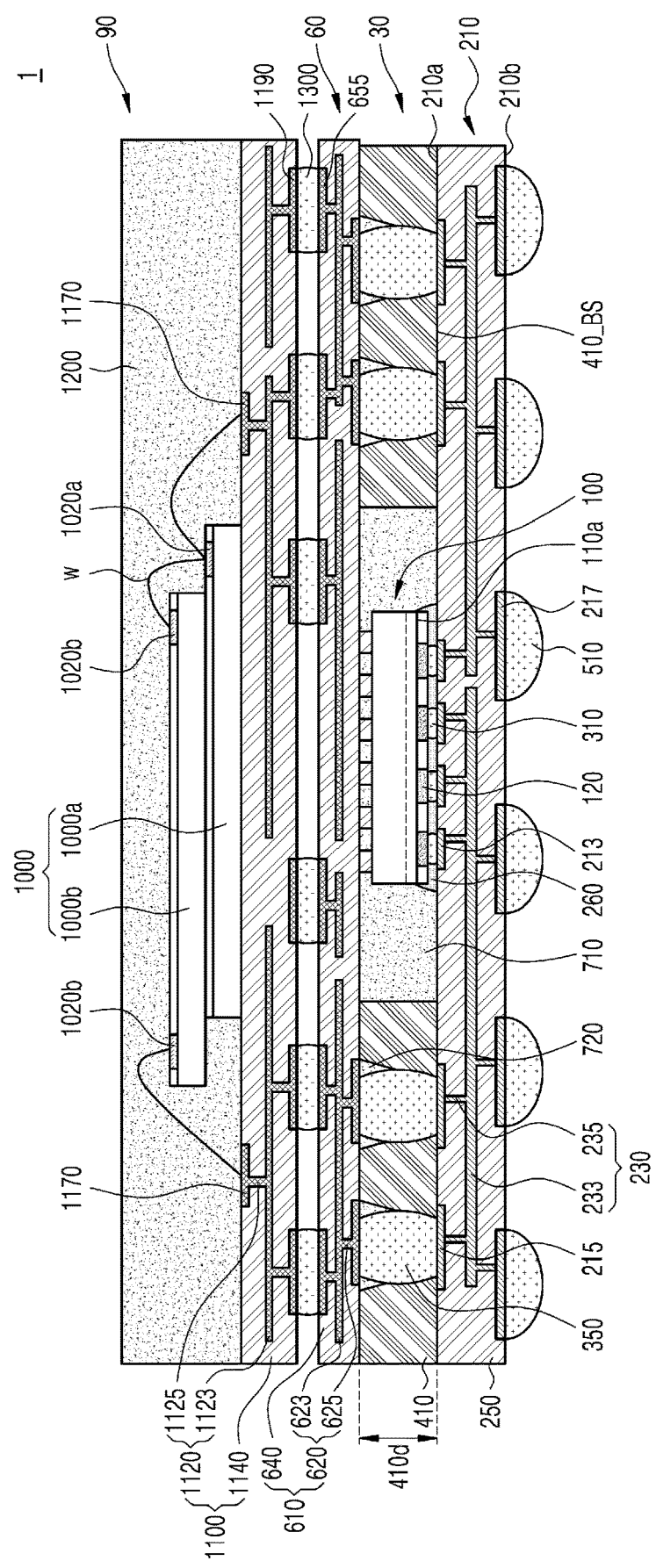
FIG. 6 is a cross-sectional view of a semiconductor package according to an exemplary embodiment of the present inventive concept.

The interposer 60 may be a structure for electrically connecting the lower semiconductor package 10 of FIG. 1 to an upper semiconductor package 90 of FIG. 6 to each other.

The interposer 60 may include an interposer substrate 610, a first interposer substrate pad 653, a second interposer substrate pad 655, an interposer connecting terminal 630, and an interposer protruding member 690.

In an exemplary embodiment of the present inventive concept, the interposer substrate 610 may include at least one of a carrier, a PCB, and/or a wafer. In addition, the interposer substrate 610 may include an interposer substrate pattern 620 and an interposer insulation layer 640 at least partially surrounding the interposer substrate pattern 620.

The interposer substrate pattern 620 may include an interposer substrate line pattern 623 and an interposer insulation layer 640. The interposer substrate line pattern 623 may extend in a horizontal direction within the interposer insulation layer 640, and the interposer substrate via pattern 625 may extend in a vertical direction within the interposer insulation layer 640.

The interposer substrate pattern 620 may include, for example, Cu. However, the material of the interposer substrate pattern 620 is not limited thereto, and for example, the interposer substrate pattern 620 may include metals such as Ni, Au, Ag, Al, W, Ti, Ta, In, Mo, Mn, Co, Sn, Mg, Re, Be, Ga, and Ru, or an alloy thereof.

The interposer insulation layer 640 may surround the interposer substrate pattern 620. In an exemplary embodiment of the present inventive concept, the interposer insulation layer 640 may include an oxide or a nitride. For example, the interposer insulation layer 640 may include silicon oxide or silicon nitride.

The first interposer substrate pad 653 may be a pad on the bottom surface of the interposer substrate 610 and configured to connect the interposer substrate pattern 620 to the interposer connecting terminal 630. For example, the first interposer substrate pad 653 may be exposed at the bottom surface of the interposer substrate 610.

In addition, the second interposer substrate pad 655 may be a pad on the top surface of the interposer substrate 610 and configured to connect the interposer substrate pattern 620 to a package connecting terminal 1300 of the upper semiconductor package (90 of FIG. 6). For example, the second interposer substrate pad 655 may be exposed at the top surface of the interposer substrate 610.

The interposer connecting terminal 630 may be a connecting terminal, which includes a conductive material and is attached on the first interposer substrate pad 653. In an exemplary embodiment of the present inventive concept, the interposer connecting terminal 630 may be a solder ball including a metal material including at least one of Sn, Ag, Cu, and/or Al.

In an exemplary embodiment of the present inventive concept, in the operation of mounting the interposer 60 on the semiconductor package 10, the interposer connecting terminal 630 of the interposer 60 may be coupled and integrated with the conductive pillar 330 of the semiconductor package 10.

The interposer protruding member 690 of the interposer 60 may protrude from the bottom surface of the interposer substrate 610. In the operation of mounting the interposer 60 on the semiconductor package 10, the interposer protruding member 690 may contact the second surface 100b of the semiconductor chip 100.

In an exemplary embodiment of the present inventive concept, the interposer protruding member 690 may have a concavo-convex shape in which concaveness and convexity are repeated. In addition, the interposer protruding member 690 may include the same material as the interposer insulation layer 640. For example, the interposer protruding member 690 may include an oxide or a nitride.

In an exemplary embodiment of the present inventive concept, in the operation of mounting the interposer 60 on the semiconductor package 10, the interposer protruding member 690 may serve as a damper for reducing the intensity of a physical collision between the semiconductor package 10 and the interposer 60.

In an exemplary embodiment of the present inventive concept, a plurality of interposer protruding members 690 may be provided. In addition, the interposer protruding members 690 may be arranged to be spaced apart from one another in a horizontal direction. A first lower molding member 710 may fill a space between the interposer protruding members 690.

In an exemplary embodiment of the present inventive concept, before the operation of mounting the interposer 60 on the semiconductor package 10, the dam structure 410 may be partially removed. Therefore, the dam structure 410 may have a second opening 410_O2 exposing at least portions of the conductive pillars 330.

Until the operation of mounting the interposer 60 on the semiconductor package 10, the conductive pillars 330 may be covered by the dam structure 410, and thus, formation of oxide films (OF of FIG. 2) on the surfaces of the conductive pillars 330 may be reduced or prevented.

Therefore, in the operation of mounting the interposer 60 on the semiconductor package 10, the reliability of an electrical connection between the semiconductor package 10 and the interposer 60 may be increased.

In an exemplary embodiment of the present invention, in the operation of mounting the interposer 60 on the semiconductor package 10, the dam structure 410 of the semiconductor package 10 may serve as a stopper. For example, the interposer 60 may descend toward the semiconductor package 10 until the bottom surface of the interposer substrate 610 and the top surface 410_US of the dam structure 410 contact each other.

In addition, because a thickness 410d of the dam structure 410 may be substantially uniform on the package substrate 210, the interposer 60 may be mounted on the semiconductor package 10 while being aligned with the semiconductor package 10 and not be inclined in a direction.

Therefore, in the operation of mounting the interposer 60 on the semiconductor package 10, excessive pressing between the conductive pillars 330 of the semiconductor package 10 and the interposer connecting terminals 630 of the interposer 60 may be prevented, and the risk of a short-circuit may be reduced.

In addition, in the operation of mounting the interposer 60 on the semiconductor package 10, separation of the conductive pillars 330 of the semiconductor package 10 and the interposer connecting terminals 630 of the interposer 60 in a vertical direction may be reduced. Therefore, the reliability of the electrical connection between the semiconductor package 10 and the interposer 60 may be increased.

Figure 4:
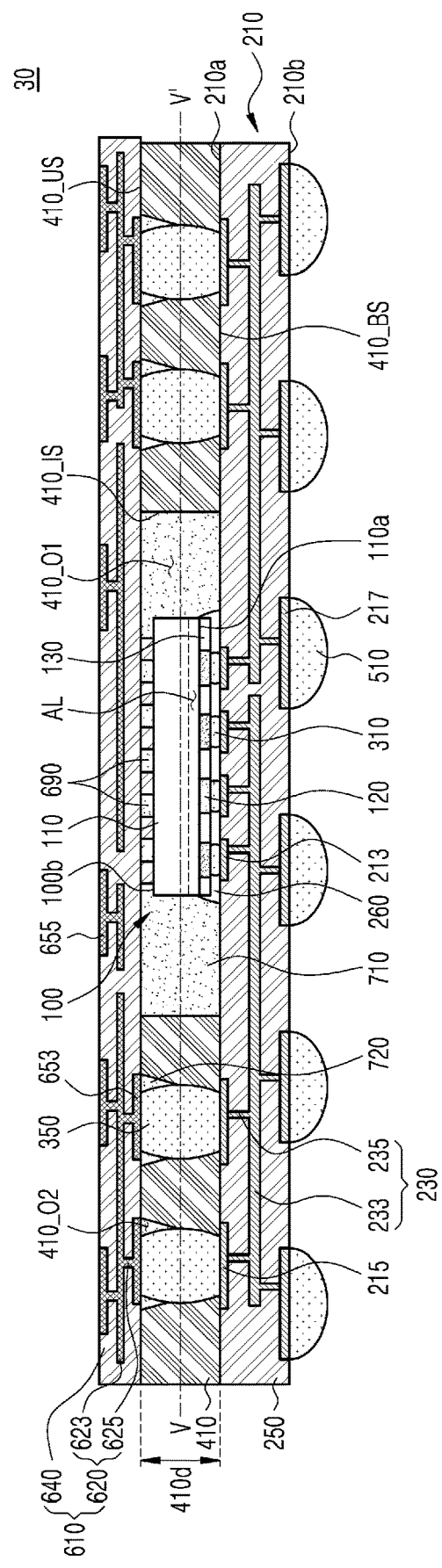
FIG. 4 is a cross-sectional view of a semiconductor package according to an exemplary embodiment of the present inventive concept.

FIG. 4 is a cross-sectional view of a semiconductor package 30 according to an exemplary embodiment of the present inventive concept. The semiconductor package 30 of FIG. 4 may be a lower semiconductor package constituting a PoP type semiconductor package. For example, the semiconductor package 30 may be a semiconductor package 50 having a structure in which the semiconductor package 10 is combined with the interposer 60 of FIG. 3.

In an exemplary embodiment of the present inventive concept, as described above, the conductive pillars 330 of the semiconductor package 10 of FIG. 3 and the interposer connecting terminal 630 of the interposer 60 may be combined (or, e.g., integrated) with each other to form interposer connecting pillars 350.

The semiconductor package 30 may further include a first lower molding member 710 and a second lower molding member 720. In an exemplary embodiment of the present inventive concept, the first lower molding member 710 may fill the first opening 410_O1 of the dam structure 410 and may cover the side surfaces and the second surface 100b of the semiconductor chip 100.

In addition, the first lower molding member 710 may be surrounded by the inner side surface 410_IS of the dam structure 410, the top surface of the package substrate 210, and the bottom surface of the interposer substrate 610. The thickness of the first lower molding member 710 may be substantially the same as the thickness 410d of the dam structure 410.

In addition, the second lower molding member 720 may fill the second opening 410_O2 of the dam structure 410 and may cover at least a portion of the interposer connecting terminal 630 exposed by the second opening 410_O2 of the dam structure 410. For example, the second lower molding member 720 may cover an upper portion of the interposer connecting pillars 350.

In an exemplary embodiment of the present inventive concept, the first lower molding member 710 and the second lower molding member 720 may include an underfill material including at least one of an insulating polymer and an epoxy resin. For example, the first lower molding member 710 and the second lower molding member 720 may include an EMC.

In addition, the first lower molding member 710 and the second lower molding member 720 may include a material different from the material of the dam structure 410. Accordingly, a boundary surface may be formed at a contact portion between the first lower molding member 710 and the dam structure 410. For example, a boundary surface may be formed at a contact portion between the second lower molding member 720 and the dam structure 410. In addition, the first lower molding member 710 and the second lower molding member 720 may include substantially the same material as each other.

In an exemplary embodiment of the present inventive concept, side surfaces of the package substrate 210 of the semiconductor package 30 of the present inventive concept, side surfaces of the interposer substrate 610, and outer side surfaces of the dam structure 410 may be on the same plane as each other. For example, the side surfaces of the package substrate 210, the side surfaces of the interposer substrate 610, and the outer side surfaces of the dam structure 410 may be aligned with each other.

In addition, the bottom surface of the interposer substrate 610 of the semiconductor package 30 of the present inventive concept, the top surface 410_US of the dam structure 410, the top surface of the first lower molding member 710, and the top surface of the second lower molding member 720 may be on the same plane as each other. For example, the bottom surface of the interposer substrate 610, the top surface 410_US of the dam structure 410, the top surface of the first lower molding member 710, and the top surface of the second lower molding member 720 may be aligned with each other.

The semiconductor package 30 according to an exemplary embodiment of the present inventive concept may include the first lower molding member 710 and the second lower molding member 720 filling the inner space between the semiconductor package 10 and the interposer 60 of FIG. 3, and thus the structural reliability of the semiconductor package 30 may be increased.

Figure 5:
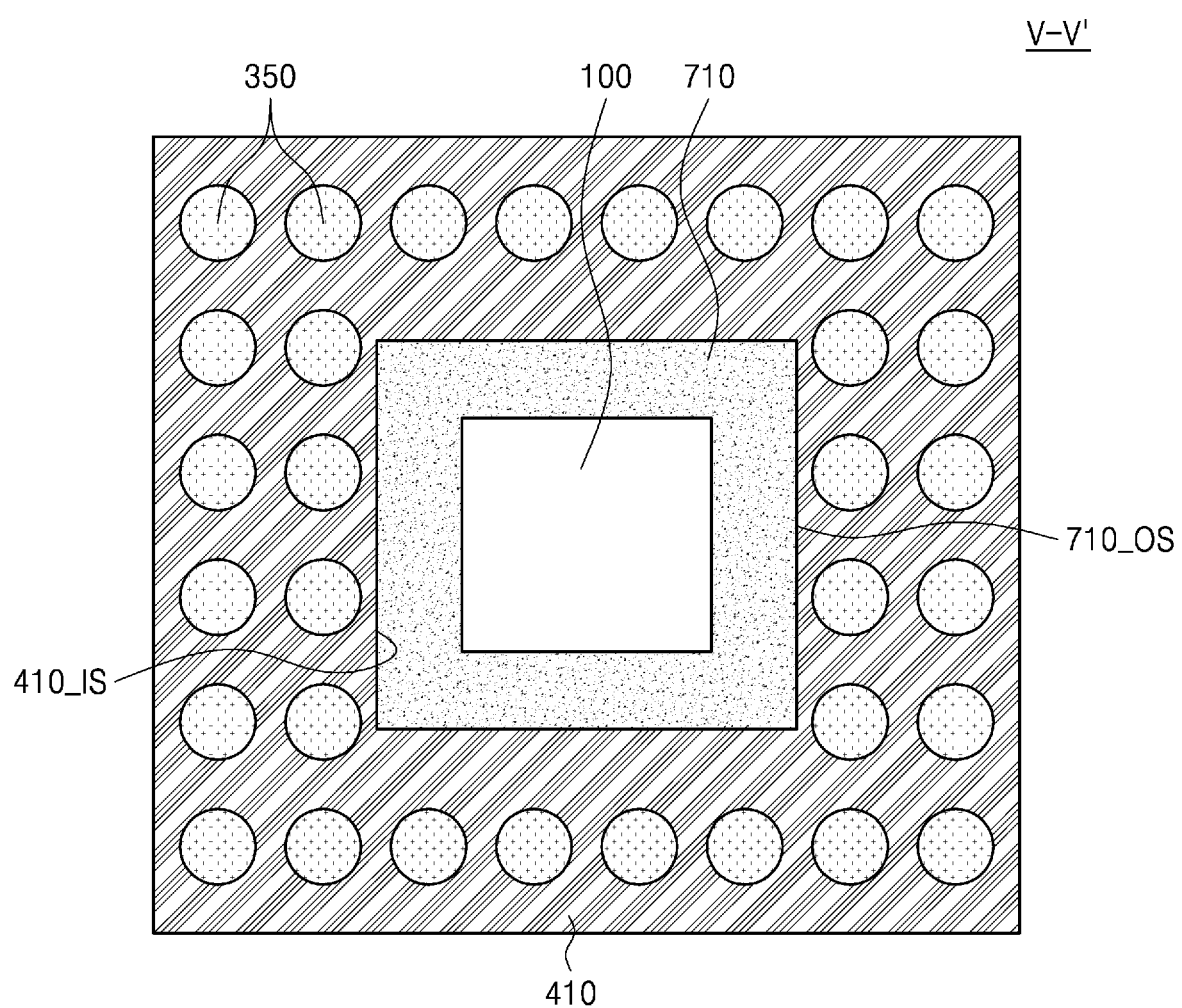
FIG. 5 is a cross-sectional view of the semiconductor package, obtained along a line V-V' of FIG. 4.

FIG. 5 is a cross-sectional view of the semiconductor package 30, obtained along a line V-V' of FIG. 4.

Referring to FIG. 5, the semiconductor chip 100 may be at a portion of the semiconductor package 30 that is substantially the center of the semiconductor package 30. In addition, the first lower molding member 710 may be between the inner side surfaces 410_IS of the dam structure 410 and the side surfaces of the semiconductor chip 100 and may at least partially surround the semiconductor chip 100. In addition, the dam structure 410 may be outside the first lower molding member 710 and surround outer side surfaces 710_OS of the first lower molding member 710.

In an exemplary embodiment of the present inventive concept, the interposer connecting pillars 350 may penetrate through the dam structure 410 in a vertical direction and may be arranged to at least partially surround the side surfaces of the semiconductor chip 100. In addition, the interposer connecting pillars 350 may pass through the dam structure 410 in a vertical direction to connect the package substrate 210 to the interposer substrate 610. The shape and number of the interposer connecting pillars 350 are not limited to those shown in FIG. 5.

In an exemplary embodiment of the present inventive concept, the dam structure 410 may be at the edges of the package substrate 210, such that the inner side surfaces of the dam structure 410 and the outer side surfaces of the first lower molding member 710 contact each other. In addition, the first lower molding member 710 may be between the dam structure 410 and the semiconductor chip 100, such that the outer side surfaces of the first lower molding member 710 and the inner side surfaces of the dam structure 410 contact each other and the inner side surfaces of the first lower molding member 710 and the side surfaces of the semiconductor chip 100 contact each other.

FIG. 6 is a cross-sectional view of a semiconductor package 1 according to according to an exemplary embodiment of the present inventive concept. The semiconductor package 1 of FIG. 6 is a PoP type semiconductor package including the lower semiconductor package 30 and the upper semiconductor package 90. For example, the semiconductor package 1 of FIG. 6 may be a PoP type semiconductor package having a structure in which the upper semiconductor package 90 is mounted on the semiconductor package 30 of FIG. 4.

The semiconductor package 1 of FIG. 6 may include the lower semiconductor package 30 and the upper semiconductor package 90. The lower semiconductor package 30 may include the package substrate 210, a lower semiconductor chip 100, the underfill member 260, the chip connecting terminal 310, the interposer connecting pillars 350, the dam structure 410, the external connecting terminal 510, the interposer 60, the first lower molding member 710, and the second lower molding member 720. Since the technical spirit of the lower semiconductor package 30 is identical to the description given above with reference to FIGS. 1 to 5, detailed description thereof may be omitted.

The upper semiconductor package 90 may include an upper semiconductor chip 1000, a re-wiring structure 1100, an upper molding member 1200, and a package connecting terminal 1300.

In an exemplary embodiment of the present inventive concept, the upper semiconductor chip 1000 may be mounted on the re-wiring structure 1100. A plurality of upper semiconductor chips 1000 may be provided. For example, the upper semiconductor chip 1000 may include a first upper semiconductor chip 1000a and a second upper semiconductor chip 1000b stacked on the first upper semiconductor chip 1000a.

In an exemplary embodiment of the present inventive concept, the second upper semiconductor chip 1000b may be mounted on the top surface of the first upper semiconductor chip 1000a. For example, the second upper semiconductor chip 1000b may be attached on the top surface of the first upper semiconductor chip 1000a via an adhesive material such as an adhesive film.

In addition, the first upper semiconductor chip 1000a and the second upper semiconductor chip 1000b may be electrically connected to each other through, for example, a conductive wire. However, the present inventive concept is not limited thereto, and the first upper semiconductor chip 1000a and the second upper semiconductor chip 1000b may be electrically connected to each other through a via electrode including a conductive material.

In an exemplary embodiment of the present inventive concept, the first upper semiconductor chip 1000a and the second upper semiconductor chip 1000b may include logic semiconductor chips. The logic semiconductor chip may include, for example, a logic semiconductor chip like a central processor unit (CPU), a micro processor unit (MPU), a graphics processor unit (GPU), or an application processor (AP).

In addition, the first upper semiconductor chip 1000a and the second upper semiconductor chip 1000b may include, for example, memory semiconductor chips. The memory semiconductor chip may include, for example, a volatile memory semiconductor chip such as dynamic random access memory (DRAM) or static random access memory (SRAM) and may also include a non-volatile memory chip such as phase-change random access memory (PRAM), magneto-resistive random access memory (MRAM) ferroelectric random access memory (FeRAM), or resistive random access memory (RRAM).

The re-wiring structure 1100 may include a re-wiring pattern 1120, a re-wiring insulation layer 1140, and a first re-wiring pad 1170, and a second re-wiring pad 1190. In an exemplary embodiment of the present inventive concept, the re-wiring pattern 1120 may include a re-wiring line pattern 1123 and a re-wiring via pattern 1125. The re-wiring line pattern 1123 extends in a horizontal direction within the re-wiring insulation layer 1140, and the re-wiring via pattern 1125 extends in a vertical direction within the re-wiring insulation layer 1140.

In an exemplary embodiment of the present invention, the re-wiring pattern 1120 may include, for example, Cu. However, the material of the re-wiring pattern 1120 is not limited thereto, and the re-wiring pattern 1120 may include metals such as Ni, Au, Ag, Al, W, Ti, Ta, In, Mo, Mn, Co, Sn, Mg, Re, Be, Ga, and Ru, or an alloy thereof.

The re-wiring insulation layer 1140 may at least partially surround the re-wiring pattern 1120. In an exemplary embodiment of the present inventive concept, the re-wiring insulation layer 1140 may include, for example, an oxide or a nitride. For example, the re-wiring insulation layer 1140 may include silicon oxide or silicon nitride.

In an exemplary embodiment of the present inventive concept, the first re-wiring pad 1170 may be a pad provided on the top surface of the re-wiring structure 1100 and configured to electrically connect the first and second upper semiconductor chips 1000a and 1000b to the re-wiring pattern 1120. For example, the first re-wiring pad 1170 may be exposed at the top surface of the re-wiring structure 1100.

In an exemplary embodiment of the present inventive concept, the first upper semiconductor chip 1000a and the second upper semiconductor chip 1000b may be connected to the re-wiring structure 1100 through a conductive wire w. For example, the conductive wire w may connect a chip pad 1020a of the first upper semiconductor chip 1000a and the first re-wiring pad 1170 of the re-wiring structure 1100 to each other. In addition, the conductive wire w may connect a chip pad 1020b of the second upper semiconductor chip 1000b and the first re-wiring pad 1170 of the re-wiring structure 1100 to each other.

In an exemplary embodiment of the present inventive concept, the second re-wiring pad 1190 may be a pad, which is on the bottom surface of the re-wiring structure 1100 and on which the package connecting terminal 1300 is mounted. For example, the second re-wring pad 1190 may be exposed at the bottom surface of the re-wiring insulation layer 1140.

In an exemplary embodiment of the present inventive concept, the upper molding member 1200 may at least partially surround the upper semiconductor chip 1000 on the re-wiring structure 1100. The upper molding member 1200 may include an underfill material including at least one of an insulating polymer and an epoxy resin. For example, the upper molding member 1200 may include an EMC.

In an exemplary embodiment of the present inventive concept, side surfaces of the upper molding member 1200 of the upper semiconductor package 90 and side surfaces of the re-wiring structure 1100 may be on the same plane as each other. For example, the side surfaces of the upper molding member 1200 and the side surfaces of the re-wiring structure 1100 may be aligned with each other.

The package connecting terminal 1300 may be a connecting terminal, which is interposed between the interposer 60 and the re-wiring structure 1100 and electrically connects the upper semiconductor chip 1000 to the interposer 60. For example, the package connecting terminal 1300 may be a solder ball including a metal material including, for example, at least one of Sn, Ag, Cu, and/or Al.

In an exemplary embodiment of the present inventive concept, the package connecting terminal 1300 may electrically connect the second re-wiring pad 1190 of the re-wiring structure 1100 and the second interposer substrate pad 655 of the interposer 60 to each other.

Figure 7:
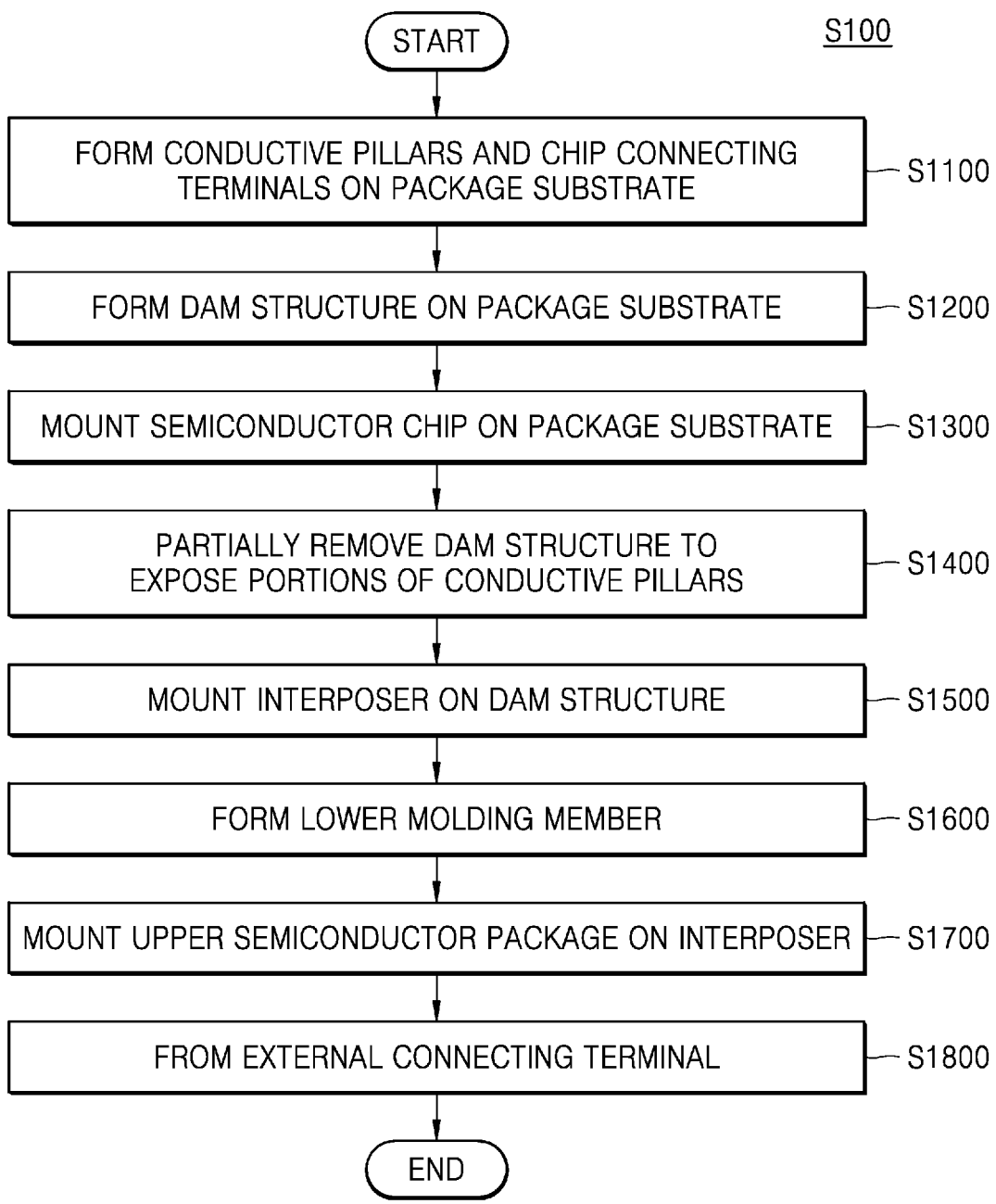
FIG. 7 is a flowchart of a method of manufacturing a semiconductor package, according to an exemplary embodiment of the present inventive concept.

FIG. 7 is a flowchart of a method S100 of manufacturing a semiconductor package, according to an exemplary embodiment of the present inventive concept. For example, the method S100 of manufacturing a semiconductor package, according to an exemplary embodiment of the present inventive concept may be a method of manufacturing the semiconductor package 1 described above with reference to FIG. 6.

In addition, FIGS. 8 to 16 are diagrams illustrating operations of the method S100 of manufacturing a semiconductor package, according to an exemplary embodiment of the present inventive concept, respectively. Hereinafter, the method S100 of manufacturing a semiconductor package will be described in detail with reference to FIGS. 7 to 16.

The method S100 of manufacturing a semiconductor package according to an exemplary embodiment of the present inventive concept may include forming the conductive pillars 330 and the chip connecting terminal 310 on the package substrate 210 (operation S1100), forming the dam structure 410 on the package substrate 210 (operation S1200), mounting the semiconductor chip 100 on the package substrate 210 (operation S1300), partially removing the dam structure 410 to expose portions of the conductive pillars 330 (operation S1400), mounting the interposer 60 on the dam structure 410 (operation S1500), forming lower molding members 710 and 720 (operation S1600), mounting the upper semiconductor package 90 on the interposer 60 (operation S1700), and forming the external connecting terminal 510 (operation S1800).

Figure 8:
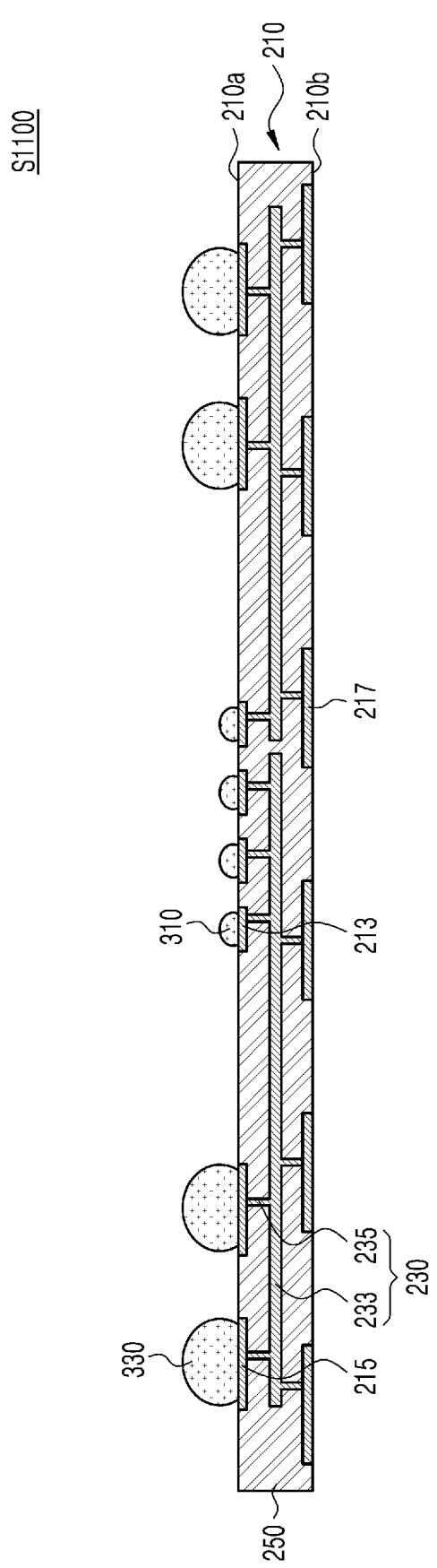
FIGS. 8, 9, 10, 11, 12, 13, 14, 15 and 16 are diagrams illustrating operations of the method of manufacturing a semiconductor package, according to an exemplary embodiment of the present inventive concept.

Referring to FIGS. 7 and 8 together, the method S100 of manufacturing a semiconductor package 1 according to an exemplary embodiment of the present inventive concept may include operation S1100 for forming the conductive pillars 330 and the chip connecting terminal 310 on the package substrate 210.

In an exemplary embodiment of the present inventive concept, in operation S1100, the chip connecting terminal 310 may be formed on the first package substrate pad 213 provided at a portion of the package substrate 210 that is substantially at the center of the package substrate 210. In addition, the conductive pillars 330 may be formed on the second package substrate pad 215 provided at the edges of the package substrate 210.

In addition, when the structure of FIG. 8 is viewed from above, the conductive pillars 330 may be arranged on the top surface 210*a* of the package substrate 210 to at least partially surround the chip connecting terminal 310. In an exemplary embodiment of the present inventive concept, the chip connecting terminal 310 and the conductive pillars 330 may be solder balls including a metal material including, for example, at least one of Sn, Ag, Cu, and/or Al.

Figure 9:
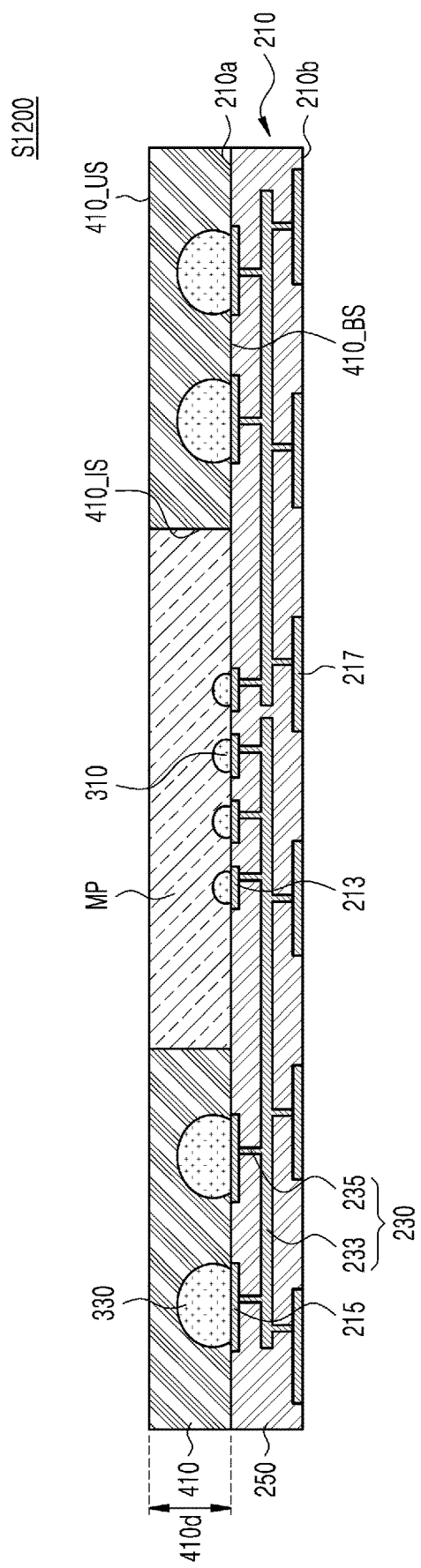

Referring to FIGS. 7 and 9 together, the method S100 of manufacturing the semiconductor package 1 according to an exemplary embodiment of the present inventive concept may include operation S1200 for forming the dam structure 410 on the package substrate 210.

In an exemplary embodiment of the present inventive concept, operation S1200 may include forming a mask pattern MP on the package substrate 210, forming the dam structure 410 on the package substrate 210, and removing the mask pattern MP.

In an exemplary embodiment of the present inventive concept, the mask pattern MP may be formed on a portion of the package substrate 210 that is substantially at the center of the package substrate 210 to at least partially surround the chip connecting terminal 310. However, the mask pattern MP may not surround the conductive pillars 330 formed at the edges of the package substrate 210.

After the forming of the mask pattern MP, the forming of the dam structure 410 on the top surface 210*a* of the package substrate 210 may be performed. In an exemplary embodiment of the present inventive concept, the dam structure 410 may be a solder resist material layer. For example, the solder resist material layer may include a reactive organic material as a base material and may include at least one of an epoxy that may be cured thermally, an acrylic material that may be cured with ultraviolet rays, and an insulating polymer.

In an exemplary embodiment of the present inventive concept, the dam structure 410 may be applied in a liquid state on the top surface 210*a* of the package substrate 210 and then cured through a thermal reaction.

However, the present inventive concept is not limited thereto, and the dam structure 410 may be provided as a structure in which a plurality of films are stacked, and the dam structure 410 may be attached on the top surface 210*a* of the package substrate 210.

In an exemplary embodiment of the present inventive concept, the thickness 410*d* of the dam structure 410 may be between about 120 micrometers and about 500 micrometers. For example, the thickness 410*d* of the dam structure 410 may be from about 150 micrometers to about 200 micrometers.

In an exemplary embodiment of the present inventive concept, the dam structure 410 may cover surfaces of the conductive pillars 330. For example, the dam structure 410 may cover all surfaces of the conductive pillars 330. For example, after operation S1200 is performed, the conductive pillars 330 may not be exposed to the outside. Therefore, formation of oxide films on the surface of the conductive pillars 330 may be reduced.

In addition, after the forming of the dam structure 410, the removing of the mask pattern MP may be performed. The mask pattern MP may be removed through, for example, an ashing process and a stripping process.

Figure 10:
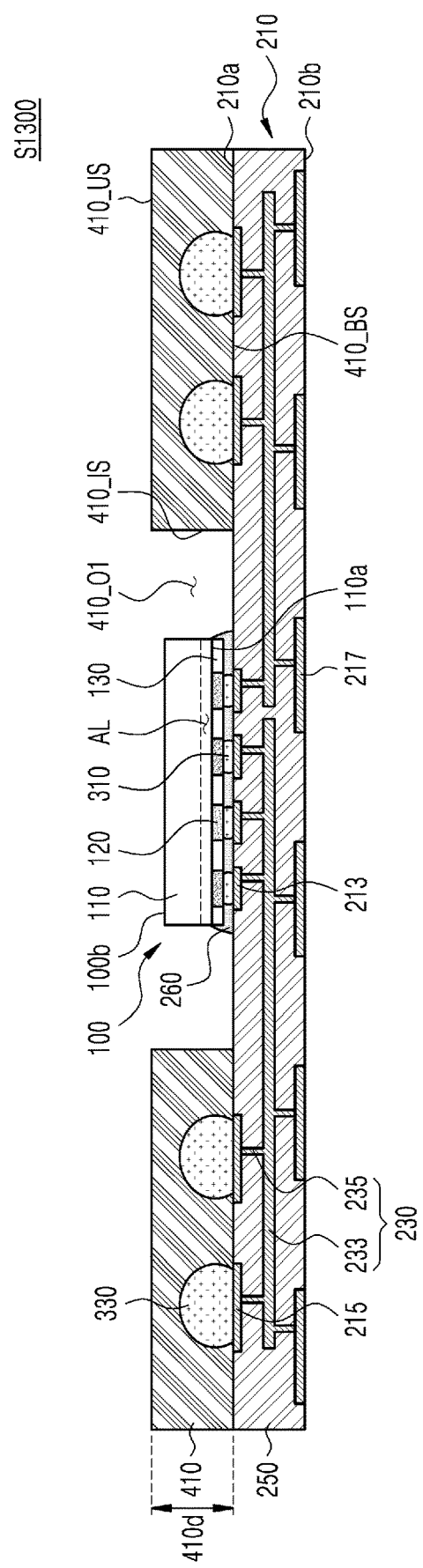

Referring to FIGS. 7 and 10 together, the method S100 of manufacturing the semiconductor package 1 according to an exemplary embodiment of the present inventive concept may include operation S1300 for mounting the semiconductor chip 100 on the package substrate 210.

The semiconductor chip 100 of FIG. 10 may be substantially the same as the semiconductor chip 100 described above with reference to FIG. 1. In operation S1300, the semiconductor chip 100 may be mounted on the package substrate 210, such that the chip pad 120 of the semiconductor chip 100 and the chip connecting terminal 310 contact each other. For example, the chip pad 120 and the chip connecting terminal 310 may be connected to each other through a reflow process.

In operation S1300, the side surfaces of the semiconductor chip 100 may be at least partially surrounded by the inner side surfaces 410_IS of the dam structure 410. In addition, the side surfaces of the semiconductor chip 100 and the inner side surfaces 410_IS of the dam structure 410 may be separated in horizontal directions, and a space therebetween may be the first opening 410_O1 of the dam structure 410.

In addition, the level of the top surface 410_US of the dam structure 410 may be higher than the level of the second surface 100*b* of the semiconductor chip 100. Therefore, in operation S1500 for mounting the interposer 60 to be described later, a physical collision between the semiconductor chip 100 and the interposer 60 may be prevented.

In an exemplary embodiment of the present inventive concept, after the mounting of the semiconductor chip 100 on the package substrate 210, an operation for injecting the underfill member 260 into the space between the semiconductor chip 100 and the package substrate 210 may be performed.

The underfill member 260 may be injected into the space between the semiconductor chip 100 and the package substrate 210 to fix the semiconductor chip 100 on the package substrate 210. In addition, the underfill member 260 may at least partially surround at least a portion of side surfaces of the semiconductor chip 100.

In an exemplary embodiment of the present inventive concept, the underfill member 260 may include at least one of an insulating polymer and an epoxy resin. For example, the underfill member 260 may include an EMC.

The structure of FIG. 10 formed by performing operations S1100 to S1300 may be the semiconductor package 10 described above with reference to FIG. 1.

Figure 11:
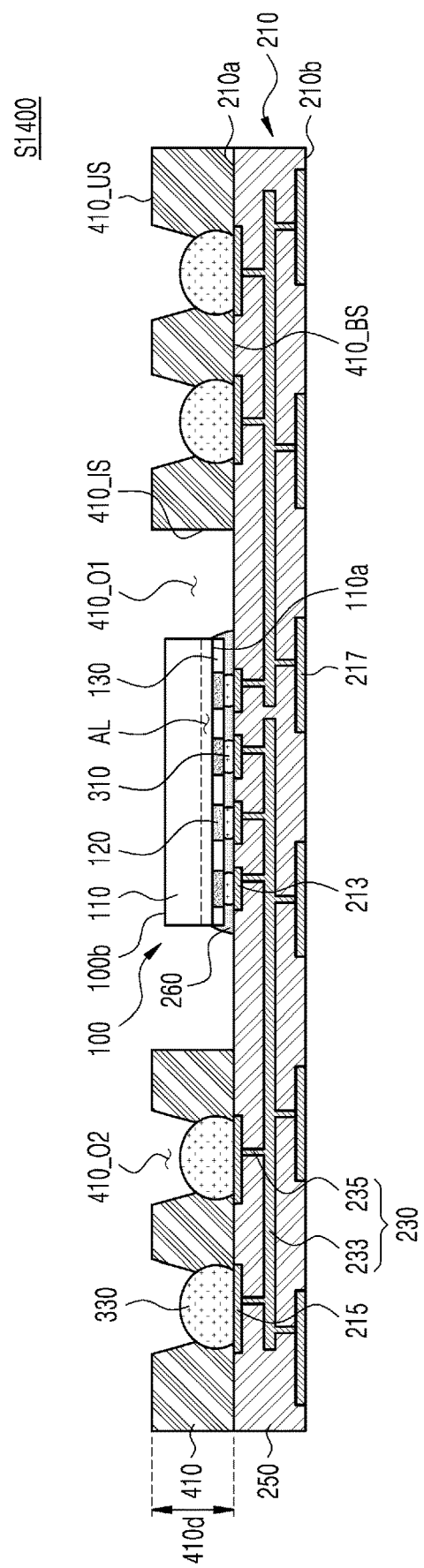

Referring to FIGS. 7 and 11 together, the method S100 of manufacturing the semiconductor package 1 according to an exemplary embodiment of the present inventive concept may include operation S1400 for partially removing the dam structure 410 to expose portions of the conductive pillars 330.

In an exemplary embodiment of the present inventive concept, in operation S1400, exposing of portions of the conductive pillar 330s by partially removing an upper portion of the dam structure 410 may be performed. For example, the dam structure 410 may be partially removed through a laser drilling process. However, the method of partially removing the dam structure 410 is not limited thereto.

In an exemplary embodiment of the present inventive concept, the second opening 410_O2 formed through partial removal of the dam structure 410 has, for example, a tapered shape in which the cross-sectional area in a horizontal direction decreases in a direction toward the package substrate 210 in a vertical direction. For example, the width of second opening 410_O2 may decrease in the direction toward the package substrate 210. However, the present inventive concept is not limited thereto. For example, the width of the second opening 410_O2 may be constant.

In addition, after the forming of the second opening 410_O2, which exposes portions of the conductive pillars 330, in the dam structure 410, an operation for cleaning surfaces of the dam structure 410 may be additionally performed.

Figure 12:
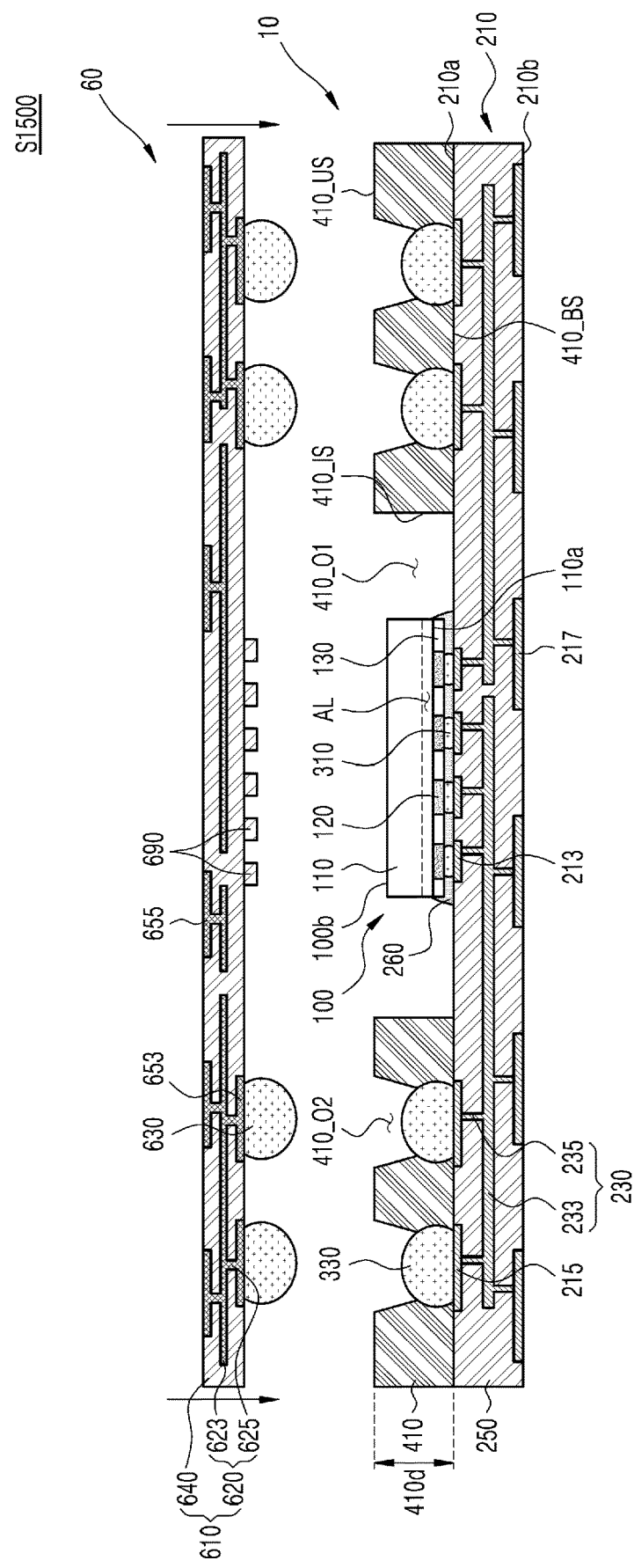
Figure 13:
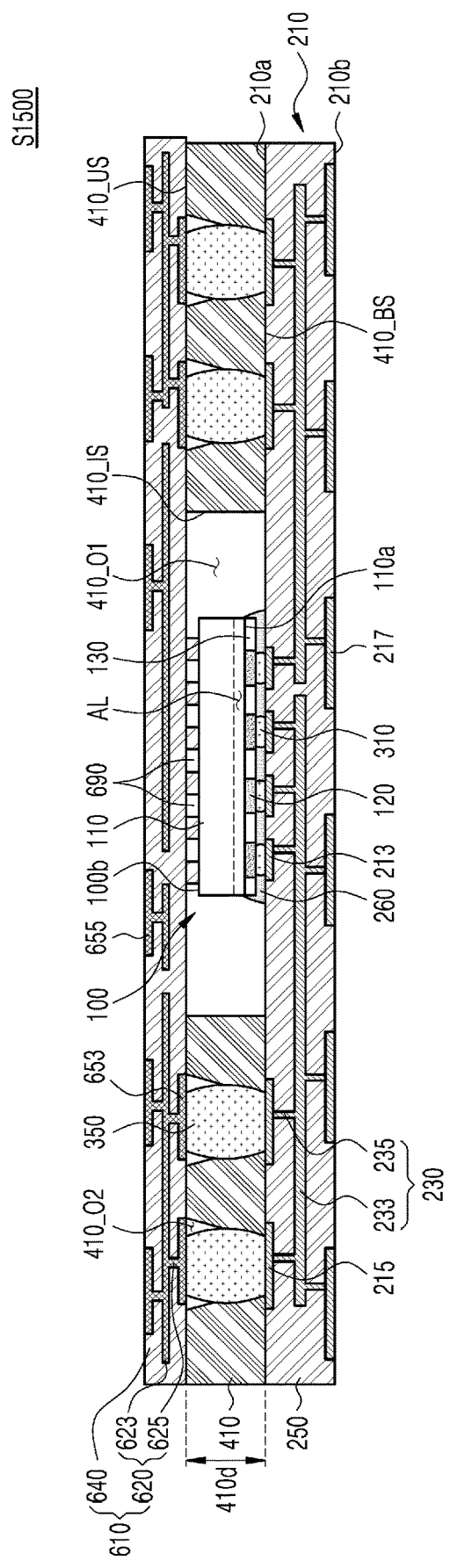

Referring to FIGS. 7, 12, and 13 together, the method S100 of manufacturing the semiconductor package 1 according to an exemplary embodiment of the present inventive concept may include operation S1500 for mounting the interposer 60 on the dam structure 410.

Since the technical spirit of the interposer 60 is identical to the description given above with reference to FIG. 3, detailed description thereof may be omitted.

In operation S1500, the interposer connecting terminals 630 of the interposer 60 may be coupled and integrated with the conductive pillars 330 of the semiconductor package 10. For example, the interposer connecting terminals 630 and the conductive pillars 330 may be integrated with each other and form the interposer connecting pillars 350 passing through the dam structure 410.

As described above, until operation S1400 for mounting the interposer 60 on the dam structure 410 is performed, the conductive pillars 330 may be covered by the dam structure 410. For example, formation of oxide films on the surfaces of the conductive pillars 330 may be reduced, and the reliability of electrical connection between the semiconductor package 10 and the interposer 60 may be increased during the mounting of the interposer 60 on the semiconductor package 10.

In an exemplary embodiment of the present inventive concept, in operation S1400, the dam structure 410 may serve as a stopper. For example, the interposer 60 may descend toward the semiconductor package 10 until the bottom surface of the interposer substrate 610 and the top surface 410_US of the dam structure 410 contact each other.

In addition, because a thickness 410d of the dam structure 410 may be substantially uniform on the package substrate 210, the interposer 60 may be mounted on the semiconductor package 10 while being aligned with the semiconductor package 10 and not inclined in a direction.

Therefore, in operation S1500, excessive pressing between the conductive pillar 330 and the interposer connecting terminal 630 may be prevented, and the risk of a short-circuit between the interposer connecting pillars 350 may be reduced.

In addition, in operation S1500, separation of the conductive pillars 330 and the interposer connecting terminals 630 in a vertical direction (e.g., a phenomenon that the interposer connecting pillars 350 are not formed) may be reduced.

Figure 14:
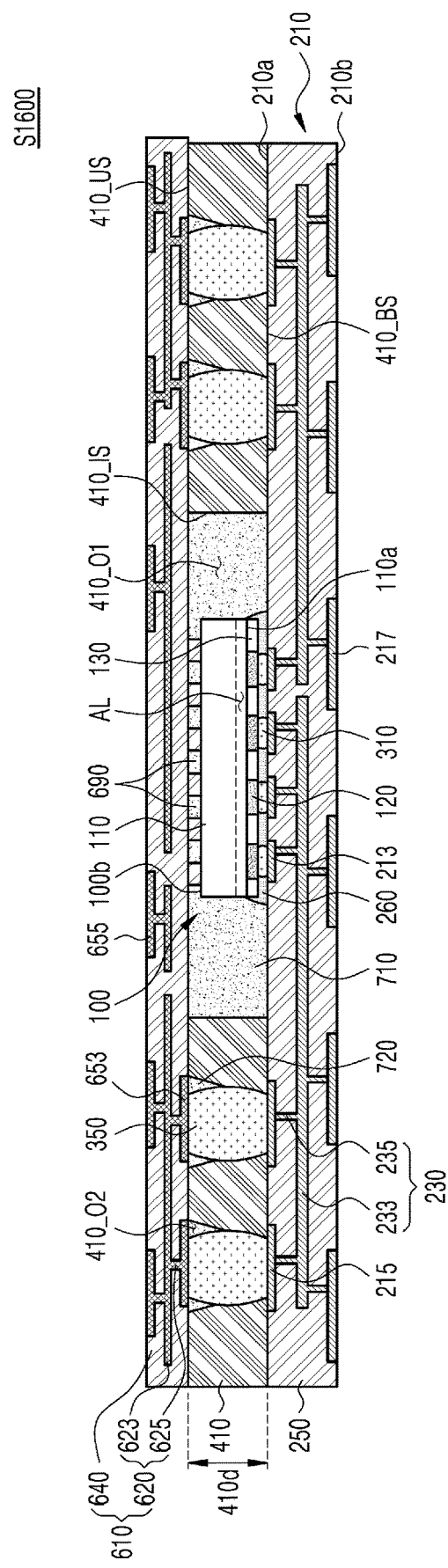

Referring to FIGS. 7 and 14 together, the method S100 of manufacturing the semiconductor package 1 according to an exemplary embodiment of the present inventive concept may include operation S1600 for forming the first lower molding member 710 and the second lower molding member 720.

In an exemplary embodiment of the present inventive concept, operation S1600 may include filling the first opening 410_O1 of the dam structure 410 with the first lower molding member 710. For example, the first lower molding member 710 may be injected into spaces between the interposer substrate 610, the package substrate 210, and the dam structure 410.

Therefore, the first lower molding member 710 may be at least partially surrounded by the inner side surface 410_IS of the dam structure 410, the top surface 210a of the package substrate 210, and the bottom surface of the interposer substrate 610 and may cover a side surface of the semiconductor chip 100, for example, the second surface 100b.

In addition, operation S1600 may include filling the second opening 410_O2 of the dam structure 410 with the second lower molding member 720. For example, the second lower molding member 720 may be injected into spaces between the interposer substrate 610, the interposer connecting pillars 350, and the dam structure 410.

Therefore, the second lower molding member 720 may cover at least portions of the interposer connecting pillars 350.

In an exemplary embodiment of the present inventive concept, the first lower molding member 710 and the second lower molding member 720 may include substantially the same material as each other. For example, the first lower molding member 710 and the second lower molding member 720 may include an underfill material including at least one of an insulating polymer and an epoxy resin. For example, the first lower molding member 710 and the second lower molding member 720 may include an EMC.

In addition, the forming of the first lower molding member 710 and the forming of the second lower molding member 720 may be performed simultaneously. However, the present inventive concept is not limited thereto.

The structure of FIG. 14 formed by performing operations S1100 to S1600 may be the semiconductor package 30 described above with reference to FIG. 4. Since the first lower molding member 710 and the second lower molding member 720 may fill the first opening 410_O1 and the second opening 410_O2 of the dam structure 410, respectively, the structural reliability of the semiconductor package 30 may be increased.

Figure 15:
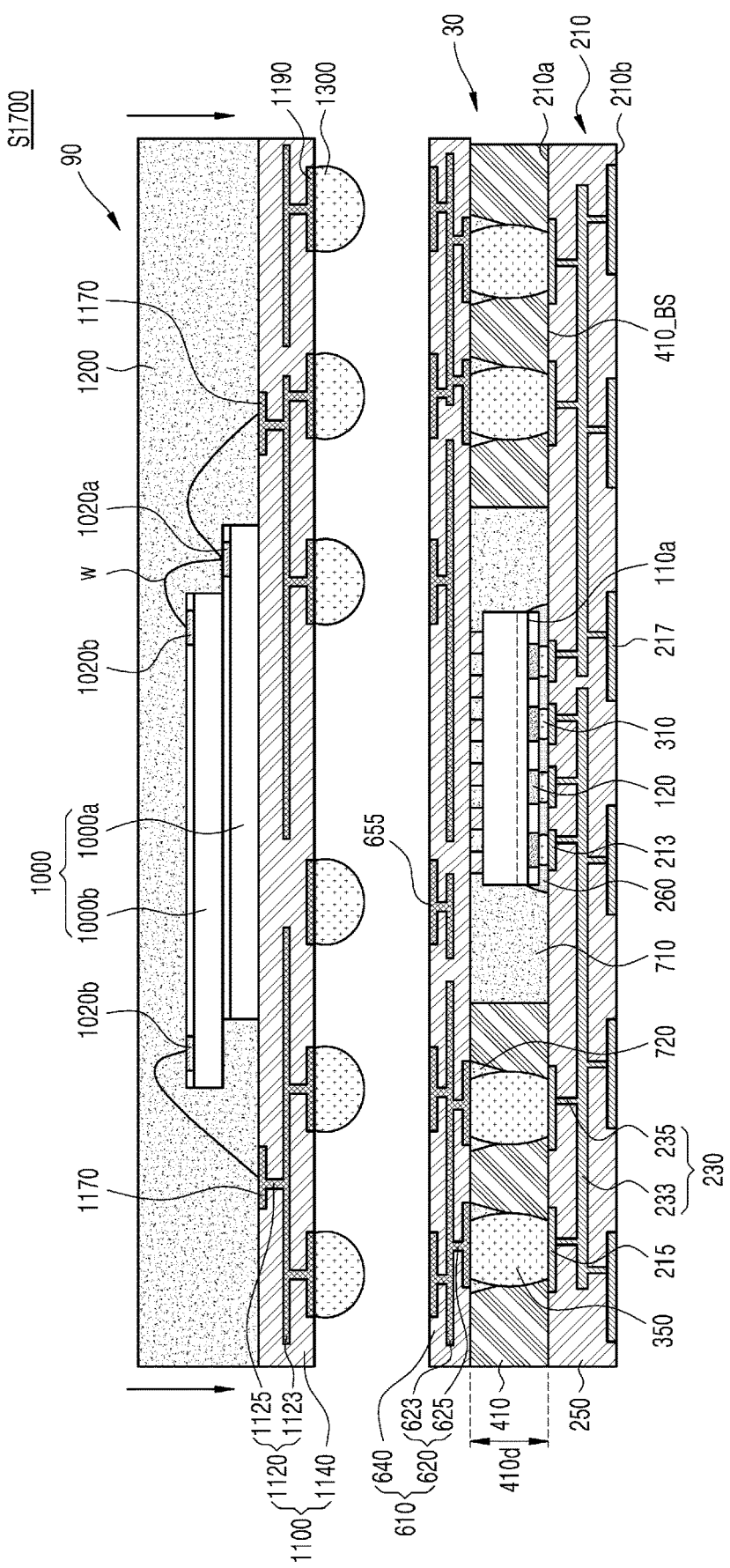

Referring to FIGS. 7 and 15, the method S100 of manufacturing the semiconductor package 1 according to an exemplary embodiment of the present inventive concept may include operation S1700 for mounting the upper semiconductor package 90 on the interposer 60. Since the upper semiconductor package 90 of FIG. 15 is identical to the upper semiconductor package 90 described above with reference to FIG. 6, detailed description thereof may be omitted.

In an exemplary embodiment of the present inventive concept, in operation S1700, the upper semiconductor package 90 may be mounted on the interposer 60, such that the package connecting terminal 1300 of the upper semiconductor package 90 contacts the second interposer substrate pad 655 of the interposer 60.

Figure 16:
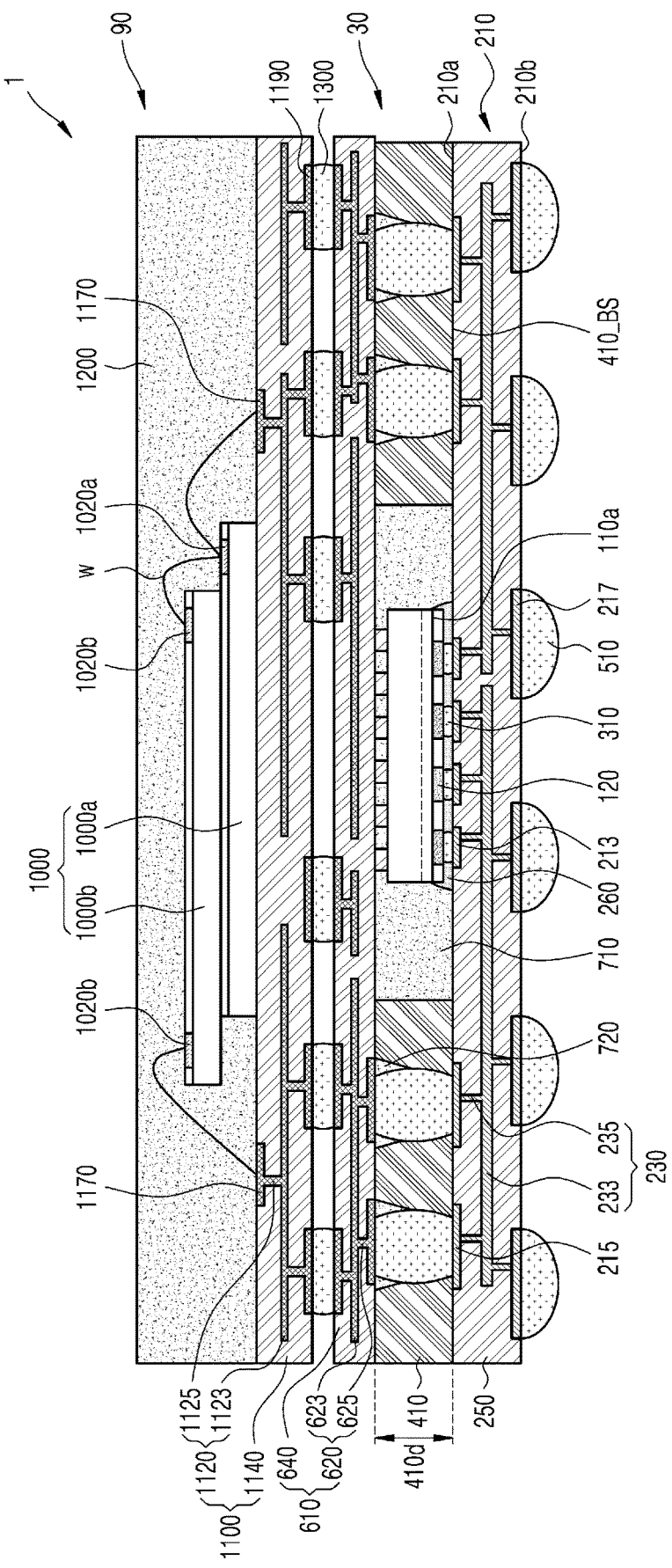

Referring to FIGS. 7 and 16, the method S100 of manufacturing the semiconductor package 1 according to an exemplary embodiment of the present inventive concept may include operation S1800 for forming the external connecting terminal 510.

In operation S1800, the external connecting terminal 510 may be attached to one surface of the third package substrate pad 217 of the package substrate 210 through a reflow process. For example, the external connecting terminal 510 may be a solder ball including a metal material including, for example, at least one of Sn, Ag, Cu, and/or Al.

The structure of FIG. 16 formed by performing operations S1100 to S1800 may be the PoP type semiconductor package 1 described above with reference to FIG. 6.

In the method S100 of manufacturing the semiconductor package 1 according to an exemplary embodiment of the present inventive concept, the conductive pillars 330 may be covered by the dam structure 410 until the interposer 60 is mounted on the dam structure 410. Therefore, formation of oxide films on the surfaces of the conductive pillars 330 may be reduced, and the reliability of an electrical connection between the conductive pillars 330 and the interposer connecting terminals 630 may be increased.

In addition, the method S100 of manufacturing the semiconductor package 1 according to an exemplary embodiment of the present inventive concept may include forming the dam structure 410 having a substantially uniform thickness on the package substrate 210, and thus the interposer 60 may be mounted on the dam structure 410 without being inclined in a direction.

Therefore, in the operation of mounting the interposer 60 on the dam structure 410, excessive pressing between the conductive pillars 330 and the interposer connecting terminals 630 may be prevented, and the risk of a short-circuit between the interposer connecting pillars 350 may be reduced.

In addition, in the operation of mounting the interposer 60 on the dam structure 410, separation of the conductive pillars 330 and the interposer connecting terminals 630 in a vertical direction may be reduced. Therefore, the reliability of the electrical connection structure of the semiconductor package 1 may be increased.

While the present inventive concept has been described with reference to embodiments thereof, it will be understood by those of ordinary skill in the art that various changes in form and details may be made thereto without departing from the spirit and scope of the present inventive concept.

What is claimed is:

1. A lower semiconductor package of a package-on-package type semiconductor package, the lower semiconductor package comprising:
a package substrate;
a semiconductor chip having a first surface facing the package substrate, a second surface opposite to the first surface mounted on the package substrate;
a chip connecting terminal disposed between the semiconductor chip and the package substrate and configured to connect the semiconductor chip to the package substrate;
conductive pillars arranged on the package substrate to at least partially surround the semiconductor chip; and
a dam structure configured to cover the conductive pillars on the package substrate and having a first opening at least partially surrounding the semiconductor chip,
wherein a level of a top surface of the dam structure is higher than a level of the second surface of the semiconductor chip.

2. The lower semiconductor package of claim 1, wherein the dam structure comprises a solder resist material layer.

3. The lower semiconductor package of claim 2, further comprising a lower molding member disposed in the first opening of the dam structure and surrounded by the dam structure.

4. The lower semiconductor package of claim 1, wherein a thickness of the dam structure ranges from about 150 micrometers to about 200 micrometers.

5. A lower semiconductor package of a package-on-package type semiconductor package, the lower semiconductor package comprising:
a package substrate;
a semiconductor chip mounted on the package substrate;
a chip connecting terminal disposed between the semiconductor chip and the package substrate and configured to connect the semiconductor chip to the package substrate;
conductive pillars arranged on the package substrate to at least partially surround the semiconductor chip; and
a dam structure configured to cover the conductive pillars on the package substrate and having a first opening at least partially surrounding the semiconductor chip,
wherein the semiconductor chip comprises:
a semiconductor substrate having a first surface facing the package substrate, a second surface opposite to the first surface, and an active layer adjacent to the first surface;
a chip pad on the first surface of the semiconductor substrate and connected to the active layer; and
a passivation layer at least partially surrounding the chip pad on the first surface of the semiconductor substrate, and
further comprising an underfill member at least partially surrounding the chip connecting terminal between the package substrate and the semiconductor chip.

6. The lower semiconductor package of claim 5, wherein a level of a top surface of the dam structure is higher than a level of the second surface of the semiconductor chip.

7. A lower semiconductor package of a package-on-package type semiconductor package, the lower semiconductor package comprising:
  a package substrate;
  a semiconductor chip mounted on the package substrate;
  a chip connecting terminal disposed between the semiconductor chip and the package substrate and configured to connect the semiconductor chip to the package substrate;
  a dam structure disposed at edges of the package substrate and having a first opening at least partially surrounding the semiconductor chip;
  an interposer comprising an interposer substrate mounted on the dam structure;
  interposer connecting pillars at least partially surrounding the semiconductor chip on the package substrate and passing through the dam structure in a vertical direction to connect the package substrate to the interposer substrate; and
  a first lower molding member configured to fill the first opening of the dam structure and covered by the package substrate, the dam structure, and the interposer substrate.

8. The lower semiconductor package of claim 7, wherein the dam structure comprises a solder resist material, and
  the first lower molding member comprises at least one of an insulating polymer or an epoxy resin.

9. The lower semiconductor package of claim 8, wherein the dam structure includes a material that is different from that of the first lower molding member.

10. The lower semiconductor package of claim 7, wherein a bottom surface of the interposer substrate, a top surface of the dam structure, and a top surface of the first lower molding member are on the same plane as each other, and
  wherein a side surface of the interposer substrate, an outer side surface of the dam structure; and a side surface of the package substrate are on the same plane as each other.

11. The lower semiconductor package of claim 7, wherein thicknesses of the dam structure and the first lower molding member range from about 150 micrometers to about 200 micrometers.

12. The lower semiconductor package of claim 7, wherein the dam structure comprises a second opening exposing portions of the interposer connecting pillars, and
  the lower semiconductor package further comprises a second lower molding member configured to fill the second opening of the dam structure and surrounded by the interposer substrate, the interposer connecting pillars, and the dam structure.

13. The lower semiconductor package of claim 7, wherein the interposer further comprises an interposer protruding member protruding from a bottom surface of the interposer substrate and contacting one surface of the semiconductor chip.

14. The lower semiconductor package of claim 13, wherein a plurality of interposer protruding members are provided, and the interposer protruding members are arranged spaced apart from one another in a horizontal direction on the bottom surface of the interposer substrate, and
  the first lower molding member fills a space between the interposer protruding members.

15. A package-on-package (PoP) type semiconductor package comprising:
  a lower semiconductor package; and
  an upper semiconductor package,
  wherein the lower semiconductor package comprises:
    a package substrate;
      a lower semiconductor chip mounted on the package substrate;
      a chip connecting terminal disposed between the lower semiconductor chip and the package substrate and configured to connect the lower semiconductor chip to the package substrate;
      a dam structure disposed at edges of the package substrate, and including a solder resist material and a first opening at least partially surrounding the semiconductor chip;
      an interposer comprising an interposer substrate mounted on the dam structure;
      interposer connecting pillars at least partially surrounding the semiconductor chip on the package substrate and passing through the dam structure in a vertical direction to connect the package substrate to the interposer substrate; and
      a first lower molding member, configured to fill the first opening of the dam structure and surrounded by the package substrate, the dam structure, and the interposer substrate, and
  wherein the upper semiconductor package comprises:
    a re-wiring structure;
    an upper semiconductor chip mounted on the re-wiring structure;
    an upper molding layer surrounding the upper semiconductor chip on the re-wiring structure; and
    a package connecting terminal disposed on the re-wiring structure and configured to connect the upper semiconductor chip to the interposer.

16. The PoP type semiconductor package of claim 15, wherein the dam structure comprises a second opening exposing portions of the interposer connecting pillars, and
  wherein the lower semiconductor package further comprises a second lower molding member configured to fill the second opening of the dam structure and surrounded by the interposer substrate, the interposer connecting pillars, and the dam structure.

17. The PoP type semiconductor package of claim 16, wherein the first lower molding member includes a material the same as that of the second lower molding member.

18. The PoP type semiconductor package of claim 15, wherein a bottom surface of the interposer substrate, a top surface of the dam structure, and a top surface of the first lower molding member are on the same plane as each other, and
  a side surface of the interposer substrate, an outer side surface of the dam structure, and a side surface of the package substrate are on the same plane as each other.

19. The PoP type semiconductor package of claim 15, wherein the interposer further comprises a plurality of interposer protruding members protruding from a bottom surface of the interposer substrate and contacting one surface of the lower semiconductor chip, and
  the first lower molding member fills a space between the interposer protruding members.

20. The PoP type semiconductor package of claim 15, wherein
  the dam structure surrounds the first lower molding member, such that inner side surfaces of the dam structure contact outer side surfaces of the first lower molding member, and
  the first lower molding member is disposed between the dam structure and the lower semiconductor chip, such that the outer side surfaces of the first lower molding member and the inner side surfaces of the dam structure contact each other and inner side surfaces of the first lower molding member and side surfaces of the lower semiconductor chip contact each other.

* * * * *